(12) United States Patent
Miller et al.

(10) Patent No.: US 6,518,868 B1
(45) Date of Patent: Feb. 11, 2003

(54) THERMALLY CONDUCTING INDUCTORS

(75) Inventors: Gerald Miller, Chelmsford, MA (US); William Ng, Leominister, MA (US); Bernhard Schroter, Upton, MA (US)

(73) Assignee: Galaxy Power, Inc., Westborough, MA (US)

( * ) Notice: Subject to any disclaimer, the term of this patent is extended or adjusted under 35 U.S.C. 154(b) by 0 days.

(21) Appl. No.: 09/639,189

(22) Filed: Aug. 15, 2000

(51) Int. Cl.[7] ............................................. H01F 27/08
(52) U.S. Cl. ........................................... 336/55; 336/62
(58) Field of Search ..................... 336/83, 200, 223, 336/65, 183, 55–62; 361/701–714

(56) References Cited

U.S. PATENT DOCUMENTS

| | | |
|---|---|---|
| 3,686,533 A | 8/1972 | Garnier et al. |
| 4,739,448 A | 4/1988 | Rowe et al. |
| 5,072,332 A * | 12/1991 | Abe ............................ 361/386 |
| 5,210,513 A * | 5/1993 | Khan et al. .................... 336/61 |
| 5,473,511 A | 12/1995 | Reddy et al. |
| 5,506,755 A | 4/1996 | Miyagi et al. |
| 5,576,934 A | 11/1996 | Roethlingshoefer et al. |
| 5,619,399 A | 4/1997 | Mok |
| 5,973,923 A * | 10/1999 | Jitaru ........................... 361/704 |
| 6,038,137 A | 3/2000 | Bhatt et al. |
| 6,175,500 B1 | 1/2001 | Roy |
| 6,222,733 B1 * | 4/2001 | Gammenthaler ............. 361/705 |

OTHER PUBLICATIONS

Photographs of supply module sold by Galaxy Power, Inc. prior to Aug. 15, 2000.
"Heat Dissipation—Package", IBM Tech Discl Bull. vol. 16, No. 11 Apr. 1977, Balderes, pp. 4165.

* cited by examiner

*Primary Examiner*—Lincoln Donovan
*Assistant Examiner*—Tuyen T. Nguyen
(74) *Attorney, Agent, or Firm*—Cesari and McKenna, LLP (57) ABSTRACT

An inductor for a computer power supply module is provided. The inductor includes a one-piece, single turn winding formed of a material for conducting heat and electrical current. The material having at least about five times the amount of electrically conductive material necessary for conducting electrical current.

31 Claims, 9 Drawing Sheets

THERMALLY CONDUCTING INDUCTORS

BACKGROUND OF THE INVENTION

1. Field of the Invention

This invention relates to power supply boards for computers, and more particularly, for power supply boards with inductors which conduct heat away from the board.

2. Background Information

It is standard engineering practice to mount electromagnetic inductors on a PC board along with other heat generating electrical components. Ordinarily, the inductor is placed on the board so that heat generated within the winding of the inductor is conducted along the winding terminals to a thermally conducting path, and also the heat generating electrical devices are connected so that heat is conducted along their lead wires to a thermally conducting path. Usually the thermally conducting paths are parallel to the plane of the PC board, and ultimately a heat sink is thermally connected to the heat conducting path. Also, airflow across the heat generating electrical components helps to remove heat which they generate.

When high power heat generating electrical components are attached to one side of a PC board, often it is necessary to couple a heat sink to the planar surface of the other side of the PC board in order to conduct the heat which they generate away from the components, so that the heat can be transferred to airflow by the heat sink. Then, when logic circuit elements are needed in the design, the logic circuit elements must be mounted on a second PC board. The two PC boards must then be connected by numerous electrically conducting wires, or posts, leading to a complicated mechanical structure which is expensive to manufacture.

There is needed a simplified method of conducting heat from high power heat generating electrical devices, and also there is needed a method of mounting inductors and logic circuit elements on an assembly of PC boards and heat sinks.

SUMMARY OF THE INVENTION

An inductor is arranged so that the metallic winding is used to conduct electricity around the circular path of the winding, and also is used to conduct heat from a first side of the winding, through the metallic structure of the winding, to a second side of the winding. The heat received by the metallic material of the winding at the first side is conducted along the metallic structure of the winding to a heat sink on the second side of the winding. The inductor is mounted on a PC board having high power heat generating electrical devices which generate heat also mounted on the PC board, and the heat generated by the heat generating electrical devices is conducted by the metallic material of the inductor winding to a heat sink mounted in thermal contact with the winding, and mounted substantially parallel to the plane of the PC board.

In an exemplary embodiment of the invention, the inductor has one turn. The winding is formed in the shape of a hollow, slotted cylinder with the slot substantially parallel to the axis of the cylinder, the slot forming the two electrical ends of the winding. The ends have a flattened surface to improve their contact with the planar pc board surface, and are connected electrically to a circuit by soldering the respective flattened surfaces to a copper layer of the PC board. The winding also has a flattened surface opposite the slot, and this flattened surface is thermally connected to a heat sink. Heat generated by the heat generating electrical devices is conducted through the copper layer to the winding, and is conducted through the winding to the heat sink. In a further exemplary embodiment of the invention, the heat generating electrical devices are mounted on a first side of the PC board, heat is conducted from these devices through the board by thermally conducting vias which are filled with solder to a second side of the PC board, the inductor is mounted on the second side of the PC board, the heat is conducted to the winding by the vias and copper layers of the PC board which is electrically connected to the ends of the winding. The winding then conducts the heat away from the pc board to the heat sink which is thermally attached to the winding at the flattened surface opposite to the electrical ends of the winding.

Use of the inductor winding as a thermally conducting path simplifies the assembly, and allows the components of a power supply module, namely the PC board, high power heat generating electrical components, inductor, and heat sink, to be formed into a compact unit which is easier and cheaper to manufacture than previous designs.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DETAILED DESCRIPTION OF AN ILLUSTRATIVE EMBODIMENT

Figure 1:
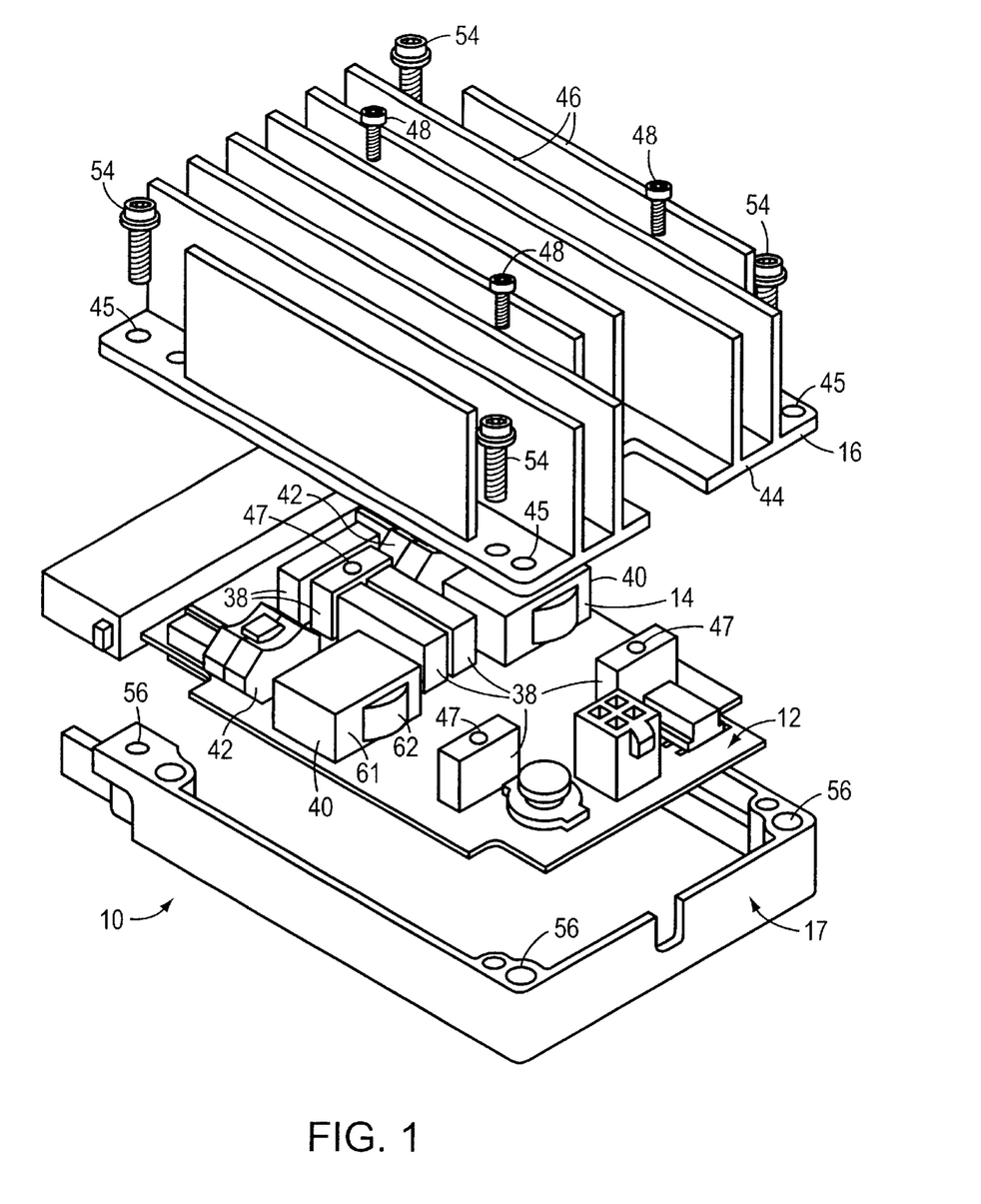
FIG. 1 is an exploded perspective view of the power supply module of the present invention.
Figure 2:
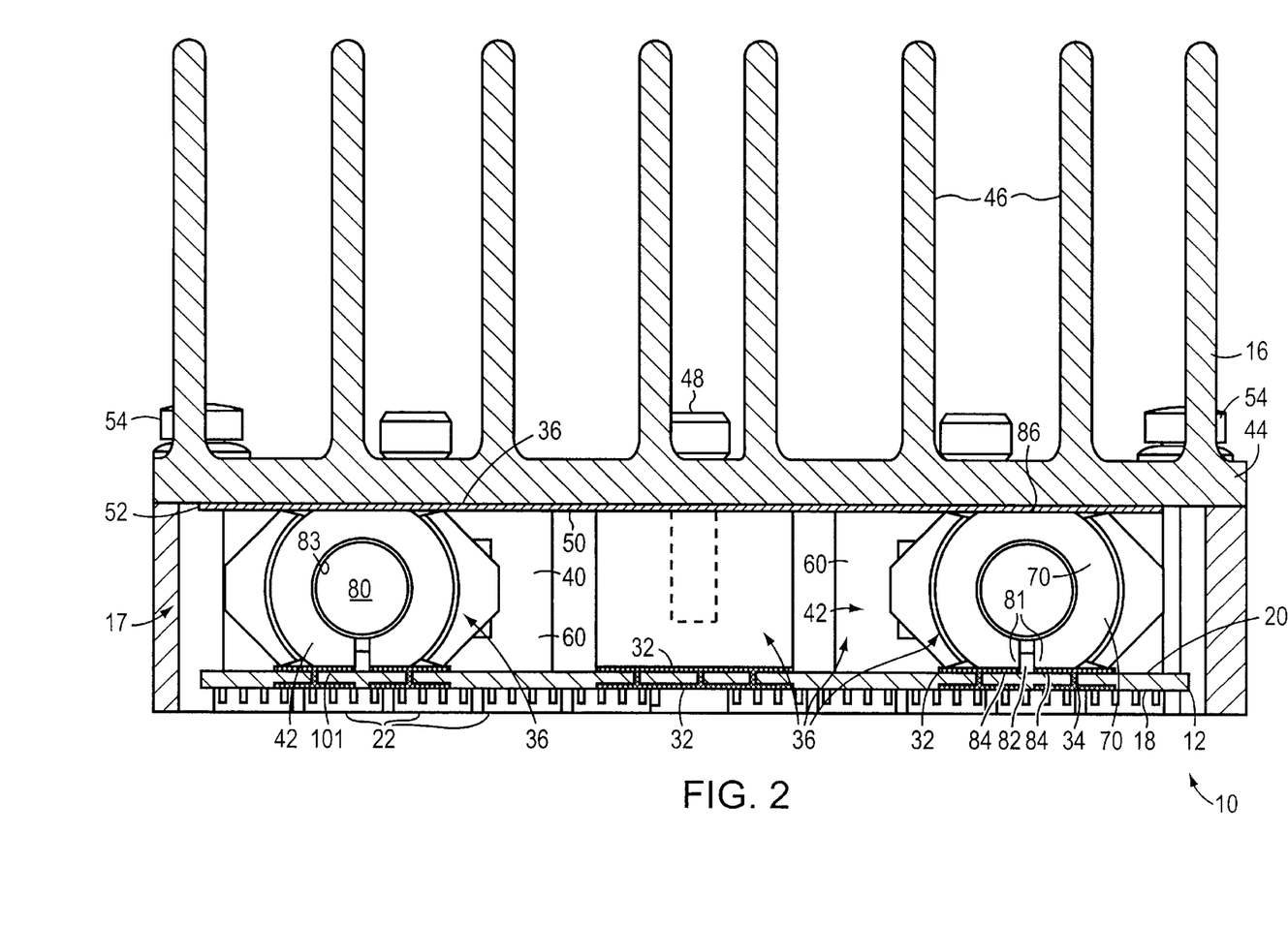
FIG. 2 is a sectional view of the assembled module of FIG. 1 where the upper and lower copper layers of the pc board have been shown for discussion purposes.

Referring to FIGS. 1 and 2, a power supply module 10 for a computer is shown. The power supply module 10 includes a multilayer printed circuit board ("pc board") 12, having power supply elements and logic control elements thereon. The power supply module 10 also includes thermal conducting structure 14, a heat sink 16, and a housing 17.

Figure 7:
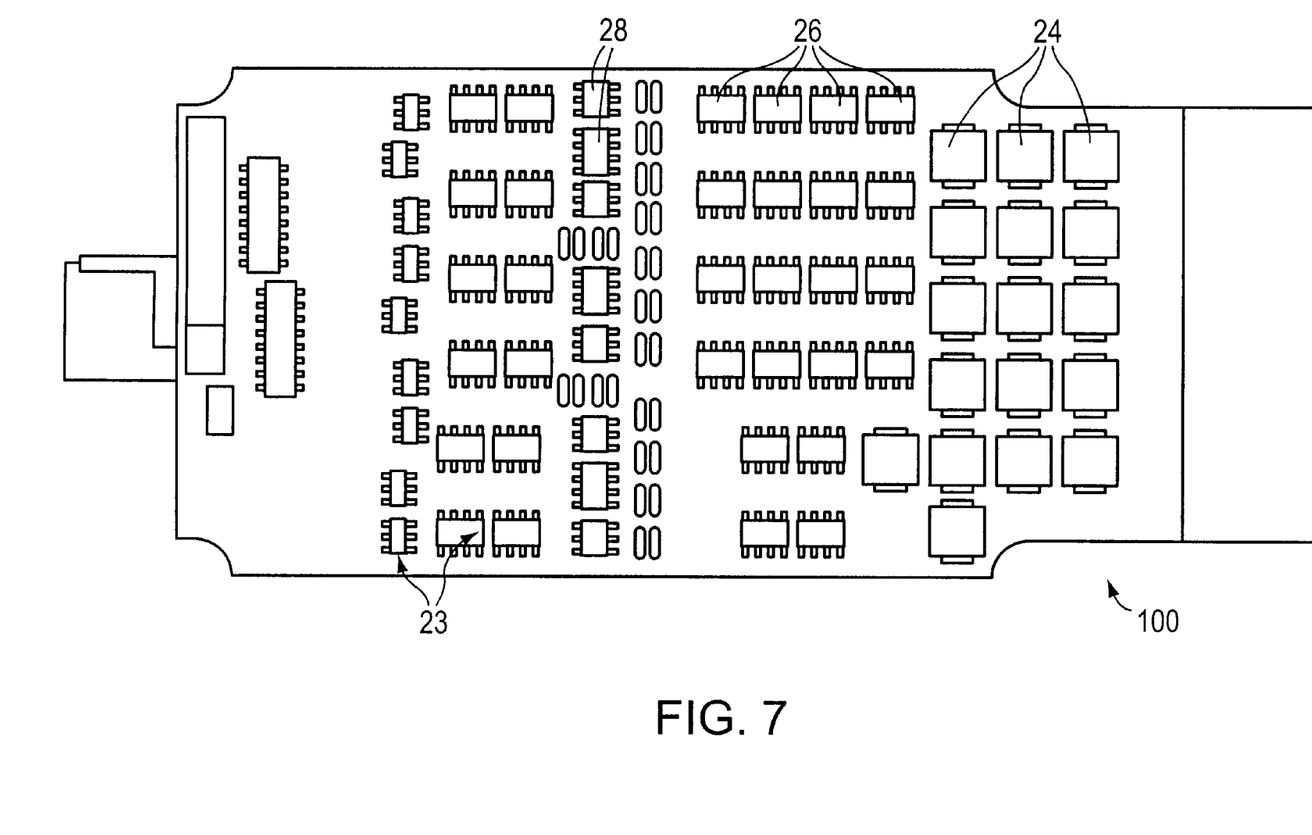
FIG. 7 is a bottom plan view of an alternative pc board of the present invention.
Figure 8:
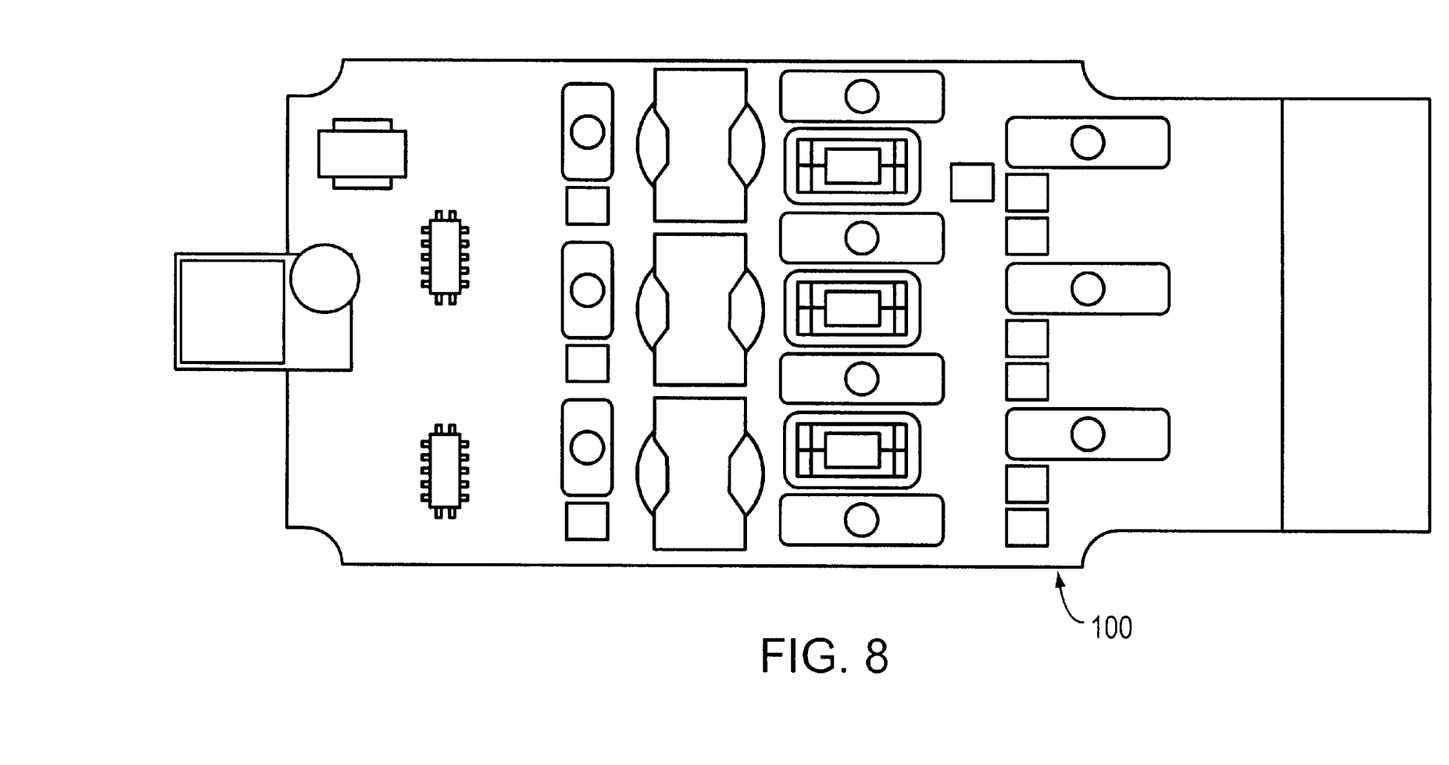
FIG. 8 is a top plan view of the alternative pc board of FIG. 7.

The pc board 12 has first and second generally parallel sides 18 and 20. On the first side 18, heat generating electrical elements 22 and logic elements 23 (see FIG. 7) are mounted. The heat generating elements 22 are usually low profile and may include, as seen in FIG. 7, where an alternative pc board 100 is shown, capacitors such as output tantalum capacitors 24 and transistors, such as synchronous FETs 26 and switching transistors 28. As seen best in FIG. 3, the heat generating electrical elements 22 have leads 30 mounted to the surface of the first side 18 of the pc board 12 by solder or the like. The heat generating electrical element 22 is typically encapsulated in a plastic housing.

Figure 3:
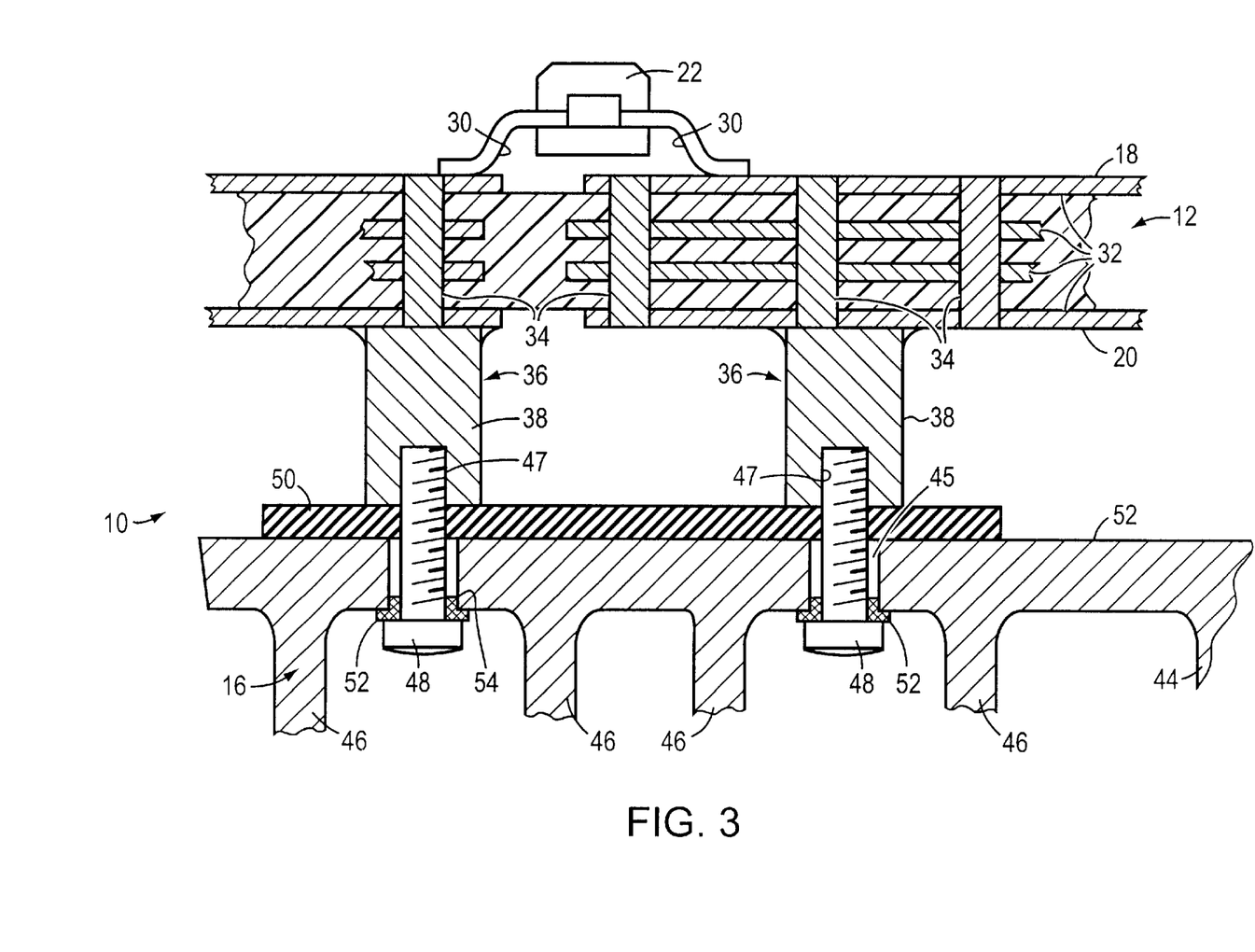
FIG. 3 is an enlarged diagrammatic sectional view illustrating the heat and electrical flow from an electrical component through the module.

As seen in FIG. 3, the pc board 12 is an industry standard pc board formed of FR4 material and in an exemplary embodiment of the invention has four copper layers 32 each having a basis weight of copper of about two ounces per square foot. The layers 32 are preferably about 0.006 inches thick and generally parallel to one another. The pc board 12 also includes hundreds of thermal vias 34 spaced throughout the entire pc board 12. The thermal vias 34 are metal plated, preferably copper plated, through holes running from the first side 18 to the second side 20. The diameter of the thermal vias 34 are preferably greater than the thickness of the copper layers 32, such as 0.025 inches. The thermal vias 34 are filled with solder and are electrically connected to the copper layers 32. Together the thermal vias 34 and the copper layers 32 form an electrical circuit.

The thermal conducting structure 14 is formed by the electrical circuit and thermal conducting member 36 disposed on the second side 20 of the pc board 12.

As seen in FIGS. 1 and 2, the thermal conducting members 36 includes thermally conducting block 38, and heat generating elements including transformers 40 and inductors 42. Each of the thermally conducting members 36 is formed at least in part by a thermally conductive material, such as a metal and/or a ferrite core in the case of the transformers 40 and inductors 42.

As seen in FIGS. 1–3, the heat sink 16 is of conventional construction and includes a base 44 with a plurality of holes 45 and a plurality of fins 46 attached to the base 44. The heat sink 16 is attached to and thermally coupled to the thermally conductive members 36 by a plurality of bolts 48 respectively passing through holes 45 in the heat sink 16 and into threaded apertures 47 in the thermally conducting blocks 38. The heat sink 16 is electrically isolated from the remainder of the module 10 by a thermally conductive, electrically isolating mat 50 disposed between the thermal conducting structures 36 and the heat sink 16. The mat 50 can be formed of a material such as silicone polymer filled with ceramic powder. A preferred mat is a 0.5 mm mat made by Alfatec Kerafol GBH, a division of MH&W of Mahwah, N.J. sold under the designation "Softtherm/Keratherm 86/200K." The heat sink 16 is also electrically isolated by placing a washer 52 with a shoulder about each of the bolts 48 so the bolts 48 do not contact the sides of the oversize hole 45.

As seen in FIGS. 2 and 3, the heat sink 16 includes a generally planar bottom surface 52, which is substantially parallel to the second side 20 of the pc board 12 to define a gap 54 therebetween. The thermal conducting members 36 each has a height substantially equal to the gap 52 to place the thermal conducting members 36 in thermal contact with both the electrical circuit formed by the thermal vias 34 and copper layers 32 and the heat sink 16.

As seen in FIGS. 1 and 2, the coupled heat sink 16, thermal conducting structure 14 and pc board 12 are attached to the housing 17 by a plurality of bolts 54 respectively passing through holes 45 in the heat sink 16 and into threaded apertures 56 in the housing 17.

The power supply module 10 of the present invention runs at high power. Typically input power is between about 150 to about 200 watts, and output power is typically from about 120 to about 180 watts. Operation of the power supply is about 80% efficient. The power loss which equates to the heat given off the during operation is thus between about 30 to about 40 watts. Thus, the power supply module 10 requires an efficient way of conducting this heat generated by the power loss away from the PC board.

The power supply module 10 conducts heat away from the heat generating electrical elements 22 as follows. Referring to FIG. 3, the heat generating electrical element 22 generates heat which is transferred through its leads 30 to the uppermost copper layer 32 which transfers the heat laterally along the plane of the copper layer 32 to one or more vias 34 which transfers the heat vertically away from the heat generating electrical element 22 directly to a thermally conducting structure 36, such as a thermal conducting block 38, as shown in FIG. 3, or to the bottom-most copper layer 32 at the second side 20 of the pc board 12 which laterally transfers the heat to one or more of the thermally conducting members 36. The thermally conducting members 36 transfer the heat vertically away from the heat generating electrical elements 22 toward the heat sink 16 and into the mat 50 which spreads the heat both laterally and vertically into the heat sink 16 and then into the air.

Figure 4:
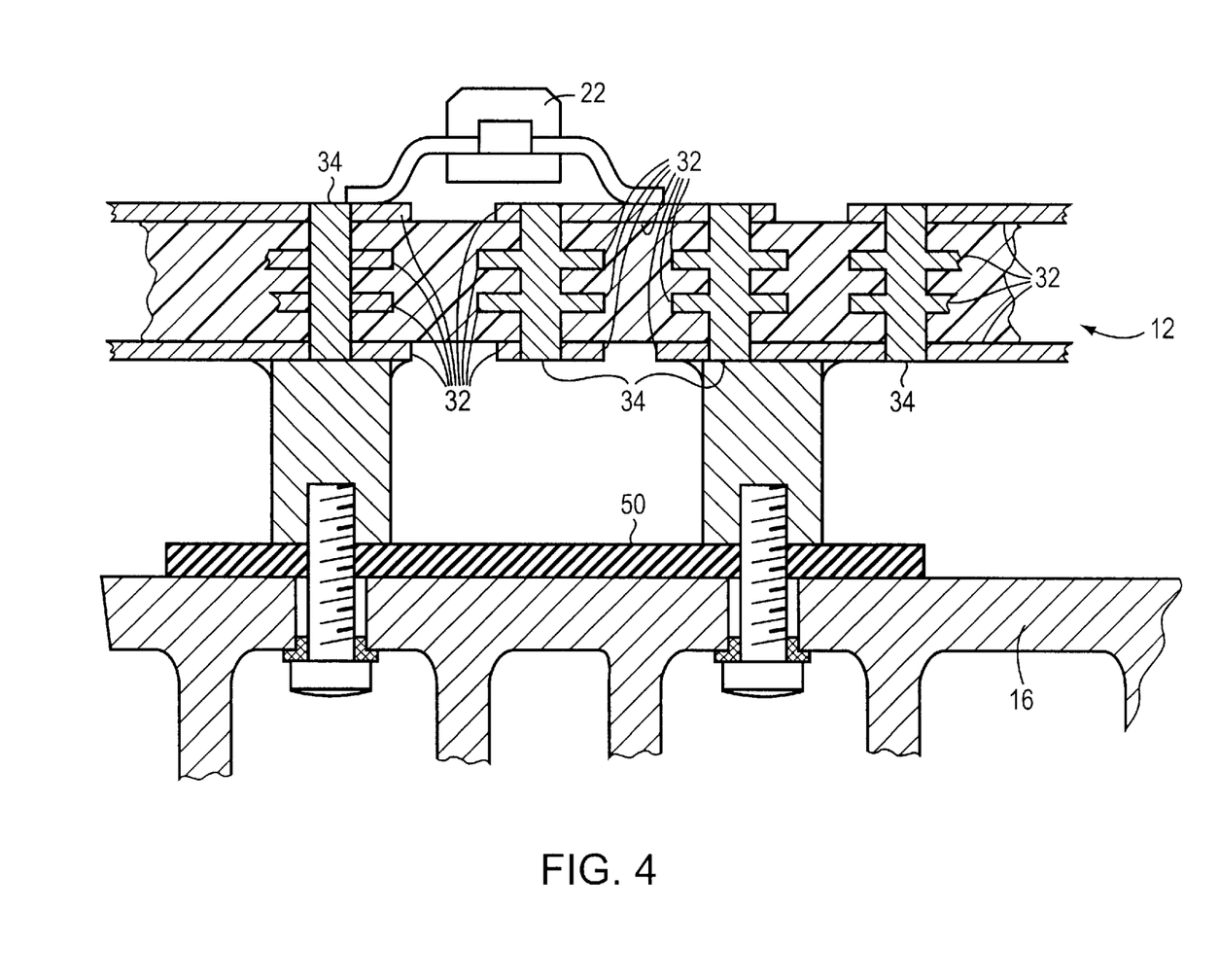
FIG. 4 is a view similar to FIG. 3, illustrating the heat and electrical paths from another electrical component through the module.

Thus, the copper layers 32 spread the heat laterally, or parallel to the first and second sides 18, 20, and the vias 34 conduct the heat vertically, or perpendicular to the first and second sides, 18, 20, from the first side 18 to the second side 20. (FIG. 4 shows where some of the copper layers 32 are not thermally or electrically connected to some of the vias 34.)

As discussed above, the thermal conducting members 36 can include heat generating components such as transformers 40 and inductors 42 formed, at least in part, by thermally conductive material. As seen in FIGS. 1 and 2, the transformer 40 includes windings 62 and a box-like housing 60 made of ferrite. The ferrite housing 60 transfers heat from the vias 34 and copper layers 32 to the mat 50.

Figure 5:
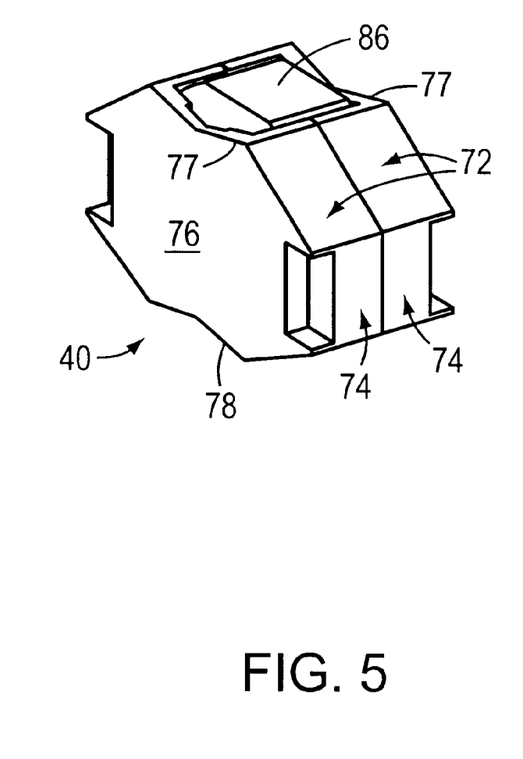
FIG. 5 is a perspective of the inductor of the present invention.
Figure 6:
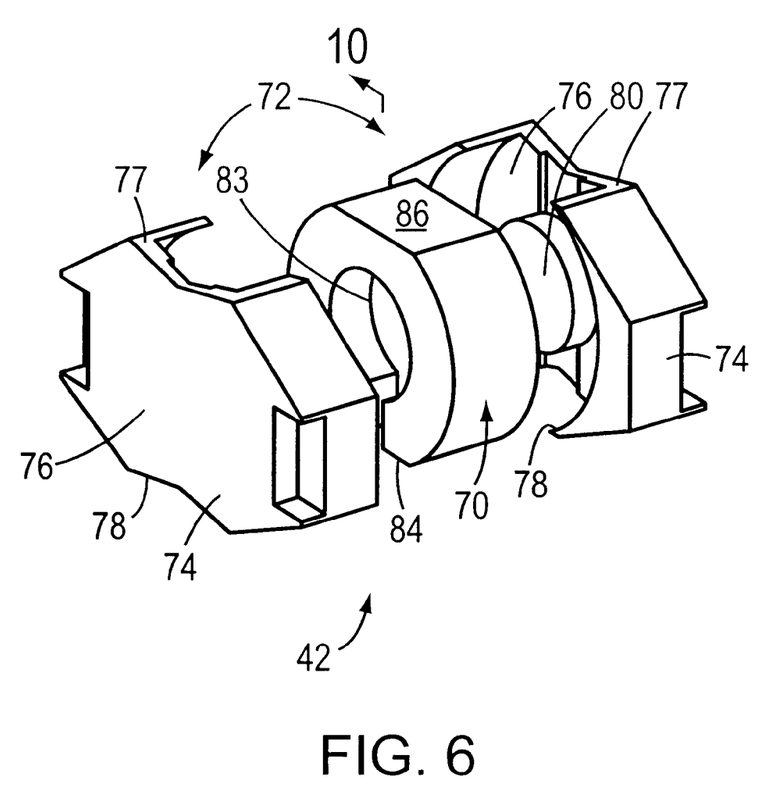
FIG. 6 is an exploded perspective view of the inductor of FIG. 5.

Similarly, the inductors 42 transfer heat. Referring to FIGS. 5 and 6, inductors 42 of the present invention are a three piece construction including a unitary one-turn winding 70 (the winding may be more than one turn if necessary) and a two piece housing 72 formed of identical housing halves 74 made of ferrite. Each half 74 has a side wall 76 and mirror image upper and lower walls 77, 78 and a cylindrical post 80 projecting inwardly from the side wall 76.

Transformer housing 60 and inductor housing 72 may be made of any suitable magnetically permeable material. For example, the housings may be made of ferrite material as commonly used in electrical arts. Alternatively, the housings 60, 72 may be made of powdered iron disposed in a suitable matrix, etc. Hereinafter, the magnetically permeable material will be referred to as "ferrite" for convenience.

Figure 10:
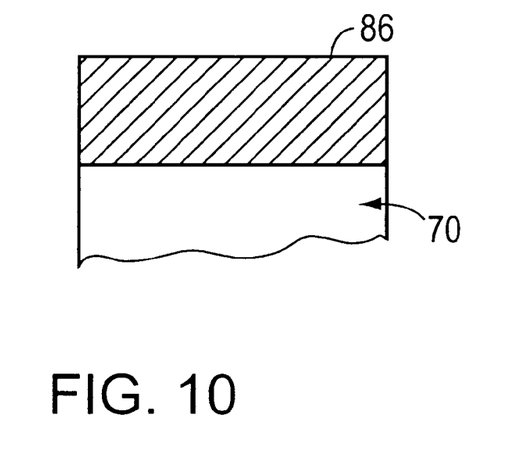
FIG. 10 is an enlarged sectional view taken generally along line 10—10 of FIG. 6.

The winding 70 is a one-piece construction formed preferably of brass having a metal content of 5 to 10 times more than is needed for conducting electrical current. In this respect, the smallest cross-sectional area, as seen in FIG. 10, of the winding is 5 to 10 times greater than is needed for conducting electrical current. Brass is preferred because it is easily soldered and is a good electrically conductive material. The winding 70 is generally cylindrical and has two ends 81 which define a slot 82. The winding 70 also defines a central hole 83. The winding 70 has a planar broken bottom end surface 84 for conducting heat and electricity, surface 84 is generally parallel to the planar upper surface 86 when conducts heat.

Referring to FIGS. 2, 5 and 6, the winding 70 is disposed between the two housing halves 74 where each of the cylindrical posts 78 are disposed in the hole 83 of the winding 70 and the upper and bottom surfaces 86, 84 of the winding 70 respectively extend through generally rectangular holes formed by the associated upper and lower walls 77, 78 of the housing halves 74.

Figure 9:
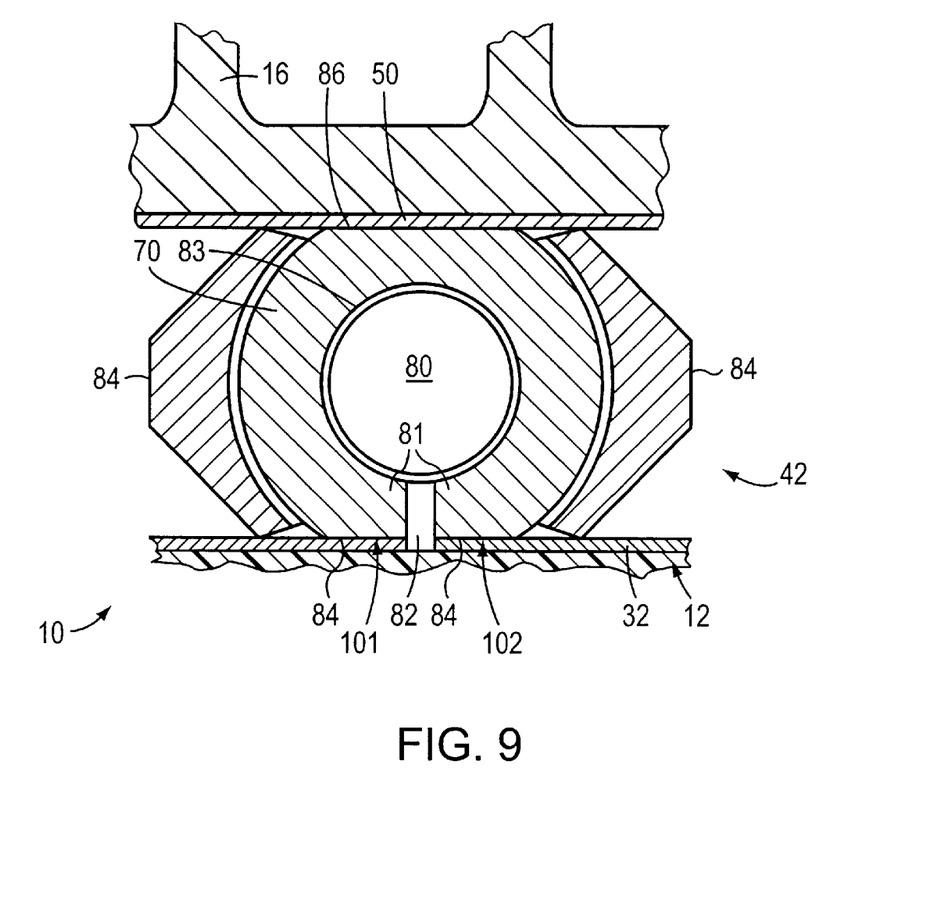
FIG. 9 is an enlarged view of a portion of FIG. 2.

As seen in FIGS. 2 and 9, each portion of the lower surface 84 is in thermal and electrical contact with the uppermost copper layer 32 and several vias 34 forming electrical connections 101 and 102 therebetween. The upper surface 86 is in thermal contact with the mat 50. Thus, the winding 70 not only transmits current but transfers heat from the heat generating electrical elements 22 toward the heat sink 16. Current flows around through the winding 70 from connection 101 to connection 102, or vice versa, while heat flows through the winding 70 from connections 101, 102 to the surface 86. Heat flow also occurs through the ferrite housing halves 84 from the pc board 12 toward heat sink 16.

Referring to FIG. 2, the winding 70 has an axis which is substantially parallel to the first and second sides 18, 20 of the pc board 12.

While particular embodiments of the present invention have been shown and described, it will be appreciated by those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An inductive device, adapted to be attached to a pc board having a first side and a second side, whereby heat generating electrical components are disposed on the first side of the board, the inductive device comprising:

an electromagnetic winding having a first and a second side, the first side of the winding adapted to be attached to the second side of the board and the second side of the winding adapted to be connected to a heat sink, wherein heat flows from the heat generating electrical components on the first side of the board, through the board to the second side of the board, into the first side of the winding, and out the second side of the winding to the heat sink.

2. The device of claim 1 wherein a magnetically permeable housing surrounds the winding.

3. The device of claim 1 wherein the first side and the second side of the winding are parallel, planar surfaces.

4. The device of claim 1 wherein the winding is one-piece and a single turn.

5. The device of claim 1 wherein the winding is formed of brass.

6. The device of claim 1 wherein the cross-sectional area of the winding is at least 5 times greater than is needed for conducting electrical current.

7. The device of claim 2 wherein the winding is adapted to be attached to the second side of the board through a first aperture in the housing and the winding is adapted to be connected to the heat sink through a second aperture in the housing.

8. The device of claim 1 wherein the inductive device is an inductor.

9. The device of claim 1 wherein the inductive device is a transformer.

10. An inductive device, attached to a pc board having a first side and a second side, whereby heat generating electrical components are disposed on the first side of the board, the inductive device comprising:

an electrical winding having a first side and a second side;

an electromagnetic material that is magnetically coupled to the winding, the electromagnetic material having a first and second aperture, whereby the first side of the winding is adapted to be attached to the second side of the board through the first aperture, and the second side of the winding is adapted to be connected to a heat sink through the second aperture, wherein heat flows from the heat generating electrical components on the the first side of the board, through the board to the second side of the board, through the first aperture to the first side of the winding, and out the second side of the winding, through the second aperture to the heat sink.

11. A method for conducting heat generated from heat generating electrical components mounted on a first side of a pc board to a heat sink coupled to a second side of the pc board, the method comprising the steps of:

attaching a first side of an inductive device to the second side of the board;

connecting a second side of the inductive device to the heat sink; and generating heat in the heat generating electrical components on the first side of the board, whereby heat flows from the heat generating electrical components on the first side of the board, through the board to the second side of the board, into the first side of the inductive device, and out the second side of the inductive device to the heat sink.

12. The method of claim 11 wherein a magnetically permeable material surrounds the inductive device.

13. The method of claim 11 wherein the first side and the second side of the inductive device are parallel, planar surfaces.

14. The method of claim 11 wherein the inductive device is one-piece and a single turn.

15. The method of claim 11 wherein the inductive device is formed of brass.

16. The method of claim 11 wherein the cross-sectional area of the inductive device is at least 5 times greater than is needed for conducting electrical current.

17. The method of claim 12 wherein the inductive device is attached to the second side of the board through a first aperture in the magnetically permeable material and the inductive device is connected to the heat sink through a second aperture in the magnetically permeable material.

18. The method of claim 11 wherein the inductive device is an inductor.

19. The method of claim 11 wherein the inductive device is a transformer.

20. A method for conducting heat generated from heat generating electrical components mounted on a first side of a pc board to a heat sink coupled to a second side of the pc board, the method comprising the steps of:

attaching a first side of a magnetically permeable housing to the pc board, the magnetically permeable housing surrounding an inductive device;

connecting a second side of the housing to the heat sink; and generating heat in the heat generating electrical components mounted on the first side of the board, whereby heat flows from the heat generating electrical components on the first side of the board, through the board to the second side of the board, into the first side of the housing, and out the second side of the housing to the heat sink.

21. The method of claim 20 wherein said first and second surfaces thermally couple to said circuit board and said heat sink through upper and lower apertures in a housing.

22. An inductive device, adapted to be attached to a pc board having a first side and a second side, whereby heat generating electrical components are disposed on the first side of the board, the inductive device comprising:

an electromagnetic winding;

a magnetically permeable housing surrounding the winding, the housing having a first and a second side, whereby the first side of the housing is adapted to be attached to the second side of the board and the second side of the housing is adapted to be connected to a heat sink, wherein heat flows from the heat generating electrical components on the first side of the board, through the board to the second side of the board, into the first side of the housing, and out the second side of the housing to the heat sink.

23. An inductive device, adapted to be attached to a pc board, whereby heat generating electrical components are disposed on the board, the inductive device comprising:

an electromagnetic winding having a first and a second side, the first side of the winding adapted to be attached to the heat generating electrical components on the board and the second side of the winding adapted to be connected to a heat sink, wherein heat flows from the heat generating electrical components on the board, into the first side of the winding, and out the second side of the winding to the heat sink.

24. The device of claim 23 wherein a magnetically permeable housing surrounds the winding.

25. The device of claim 23 wherein the first side and the second side of the winding are parallel, planar surfaces.

26. The device of claim 23 wherein the winding is one-piece and a single turn.

27. The device of claim 23 wherein the winding is formed of brass.

28. The device of claim 23 wherein the cross-sectional area of the winding is at least 5 times greater than is needed for conducting electrical current.

29. The device of claim 24 wherein the winding is adapted to be attached to the heat generating electrical components through a first aperture in the housing and the winding is adapted to be connected to the heat sink through a second aperture in the housing.

30. The device of claim 23 wherein the inductive device is an inductor.

31. The device of claim 23 wherein the inductive device is a transformer.

* * * * *